(12) United States Patent
Lee et al.

(10) Patent No.: US 10,050,100 B2
(45) Date of Patent: Aug. 14, 2018

(54) DISPLAY APPARATUS

(71) Applicant: SAMSUNG DISPLAY CO., LTD., Yongin-si, Gyeonggi-do (KR)

(72) Inventors: Jungkyu Lee, Yongin-si (KR); Donghwan Shim, Yongin-si (KR); Taehyun Kim, Yongin-si (KR); Sangho Park, Yongin-si (KR); Seungmin Lee, Yongin-si (KR); Seunghwan Cho, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/589,237

(22) Filed: May 8, 2017

(65) Prior Publication Data
US 2017/0323936 A1 Nov. 9, 2017

(30) Foreign Application Priority Data

May 9, 2016 (KR) .................. 10-2016-0056603

(51) Int. Cl.
| | | |
|---|---|---|
| H01L 29/12 | (2006.01) | |
| H01L 27/32 | (2006.01) | |
| H01L 51/52 | (2006.01) | |
| H01L 27/12 | (2006.01) | |

(52) U.S. Cl.
CPC ...... *H01L 27/3279* (2013.01); *H01L 27/3262* (2013.01); *H01L 27/3265* (2013.01); *H01L 51/5256* (2013.01); *H01L 27/124* (2013.01)

(58) Field of Classification Search
CPC ............ H01L 27/3279; H01L 27/3265; H01L 27/124; H01L 27/3262; H01L 51/5256
See application file for complete search history.

(56) References Cited

U.S. PATENT DOCUMENTS

| | | | |
|---|---|---|---|
| 9,000,428 B2 | 4/2015 | Lee et al. | |
| 2014/0284591 A1* | 9/2014 | Ono | H01L 27/3246 |
| | | | 257/40 |
| 2015/0187810 A1 | 7/2015 | Lee | |
| 2015/0228927 A1 | 8/2015 | Kim | |
| 2017/0279084 A1* | 9/2017 | Sakamoto | H01L 27/322 |

FOREIGN PATENT DOCUMENTS

| | | |
|---|---|---|
| JP | 2006-349753 | 12/2006 |
| KR | 10-2014-0133053 | 11/2014 |
| KR | 10-2015-0094950 | 8/2015 |

\* cited by examiner

*Primary Examiner* — Victor A Mandala
*Assistant Examiner* — Colleen E Snow
(74) *Attorney, Agent, or Firm* — Lee & Morse, P.C.

(57) ABSTRACT

A display apparatus includes a substrate including a display area displaying an image and a peripheral area outside the display area, a main wiring and an auxiliary wiring disposed in an identical layer in the peripheral area, the main wiring being disposed closer to the display area than the auxiliary wiring, a dam configured to cover at least a part of the main wiring, the auxiliary wiring being spaced apart from the dam, and a connecting wiring configured to connect the main wiring to the auxiliary wiring, and a thin-film encapsulation layer configured to seal the display area and the peripheral area.

15 Claims, 9 Drawing Sheets

DISPLAY APPARATUS

CROSS-REFERENCE TO RELATED APPLICATION

Korean Patent Application No. 10-2016-0056603, filed on May 9, 2016, in the Korean Intellectual Property Office, and entitled: "Display Apparatus," is incorporated by reference herein in its entirety.

BACKGROUND

1. Field

Embodiments relate to a display apparatus.

2. Description of the Related Art

A display apparatus may be used to display images, text, etc., and may be classified into liquid crystal displays, electrophoretic displays, organic light-emitting displays, inorganic light-emitting displays, field emission displays, surface-conduction electron-emitter displays, plasma displays, and cathode ray displays.

SUMMARY

Embodiments are directed to a display apparatus, including a substrate including a display area displaying an image and a peripheral area outside the display area, a main wiring and an auxiliary wiring disposed in an identical layer in the peripheral area, the main wiring being disposed closer to the display area than the auxiliary wiring, a dam configured to cover at least a part of the main wiring, the auxiliary wiring being spaced apart from the dam, and a connecting wiring configured to connect the main wiring to the auxiliary wiring, and a thin-film encapsulation layer configured to seal the display area and the peripheral area.

The connecting wiring may be disposed below the main wiring and the auxiliary wiring with an insulating layer interposed between the main wiring and the auxiliary wiring, and may be connected to the main wiring and the auxiliary wiring through contact holes penetrating the insulating layer.

The connecting wiring may extend from an upper portion of the main wiring to the upper portion of the auxiliary wiring through an upper portion of the dam, to connect the main wiring and the auxiliary wiring.

The dam may cover an edge near to the auxiliary wiring among edges of the main wiring, wherein a part of the main wiring is exposed.

The auxiliary wiring may be plural, and the plurality of auxiliary wirings may be connected to each other through the connecting wiring.

The auxiliary wiring may have a curved shape.

The thin-film encapsulation layer may include a stack structure of a first inorganic encapsulation layer, a first organic encapsulation layer, and a second inorganic encapsulation layer, and the first inorganic encapsulation layer may contact the second inorganic encapsulation layer on the auxiliary wiring.

A width of the main wiring may be greater than a width of the auxiliary wiring.

The display area may include a display device including a pixel electrode, a counter electrode facing the pixel electrode, and an intermediate layer disposed between the pixel electrode and the counter electrode, and the main wiring may be connected to the counter electrode.

The display area may include a thin-film transistor including a semiconductor layer, a gate electrode, a source electrode, and a drain electrode, and the connecting wiring may be provided in the same layer as that of the gate electrode.

The display area may include a thin-film transistor including a semiconductor layer, a gate electrode, a source electrode, and a drain electrode, and a storage capacitor overlapping the thin-film transistor, the storage capacitor may include a first electrode, a dielectric layer, and a second electrode integrally formed with the gate electrode that are sequentially stacked on the storage capacitor, and the connecting wiring may be provided in the same layer as that of the second electrode.

The display area may include a display device including a pixel electrode, a counter electrode facing the pixel electrode, an intermediate layer disposed between the pixel electrode and the counter electrode, and the connecting wiring may include the same material as that of the pixel electrode.

The display area may include a thin-film transistor including a semiconductor layer, a gate electrode, a source electrode, and a drain electrode, and the main wiring may include the same material as that of a source electrode and a drain electrode.

The dam may include a plurality of layers.

The dam may include first and second dam layers, and the connecting wiring may extend from an upper portion of the main wiring to the upper portion of the auxiliary wiring through the first and second dam layers, to connect the main wiring and the auxiliary wiring.

BRIEF DESCRIPTION OF THE DRAWINGS

Features will become apparent to those of skill in the art by describing in detail example embodiments with reference to the attached drawings in which.

DETAILED DESCRIPTION

Figure 1:
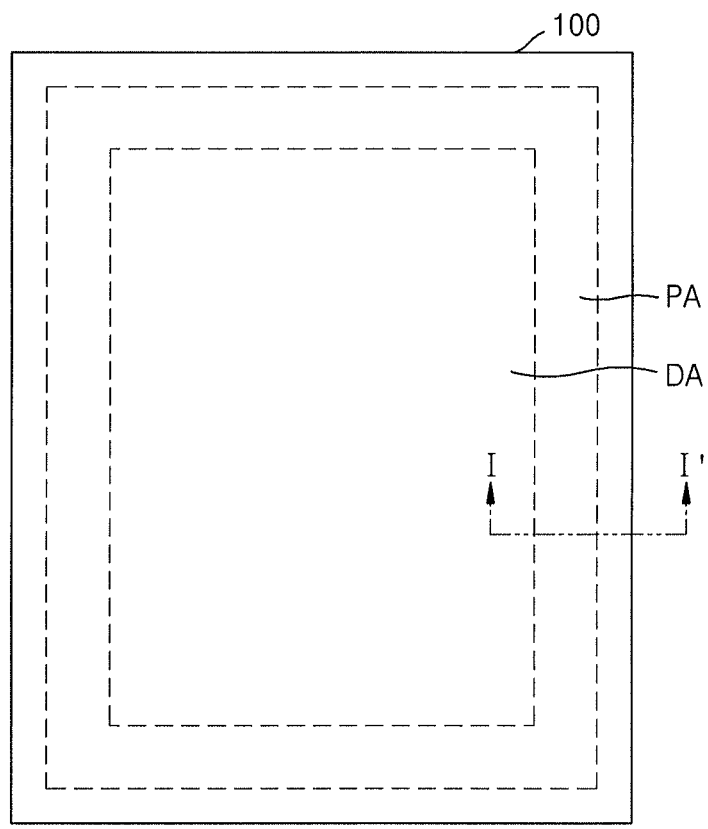
FIG. 1 illustrates is a plan view of a display apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

As used herein, the term "and/or" includes any and all combinations of one or more of the associated listed items.

It will be understood that although the terms "first", "second", etc. may be used herein to describe various components, these components should not be limited by these terms. These components are only used to distinguish one component from another.

An expression used in the singular encompasses the expression of the plural, unless it has a clearly different meaning in the context.

It will be further understood that the terms "comprises" and/or "comprising" used herein specify the presence of stated features or components, but do not preclude the presence or addition of one or more other features or components.

Hereinafter, an organic light-emitting display will be described as a display apparatus according to an example embodiment. However, a display apparatus according to an example embodiment may be various kinds of display apparatuses besides the organic light-emitting display.

FIG. 1 is a plan view of a display apparatus according to an example embodiment.

As illustrated in FIG. 1, the display apparatus according to the present example embodiment may include a substrate 100. The substrate 100 may include a display area DA and a peripheral area PA outside the display area DA.

The display area DA of the substrate 100, in which a plurality of pixels are disposed, may display an image. The display area DA may include various display devices such as an organic light-emitting device (OLED), thin-film transistors (TFTs), or capacitors, and may display an image by pixels formed by electrical coupling of the display devices, the TFTs, and the capacitors. Drive current through a display device may be generated according to a gate signal, a data signal, a driving voltage ELVDD, and a common voltage ELVSS that are supplied to the pixels, and the display device may emit light with brightness corresponding to the drive current.

The peripheral area PA may be outside the display area DA, and wirings supplying various signals and/or power to the display area DA may be disposed in the peripheral area PA. Furthermore, the peripheral area PA may further include a TFT to control an electrical signal applied to the inside of the display area DA, in addition to the wirings.

Figure 2:
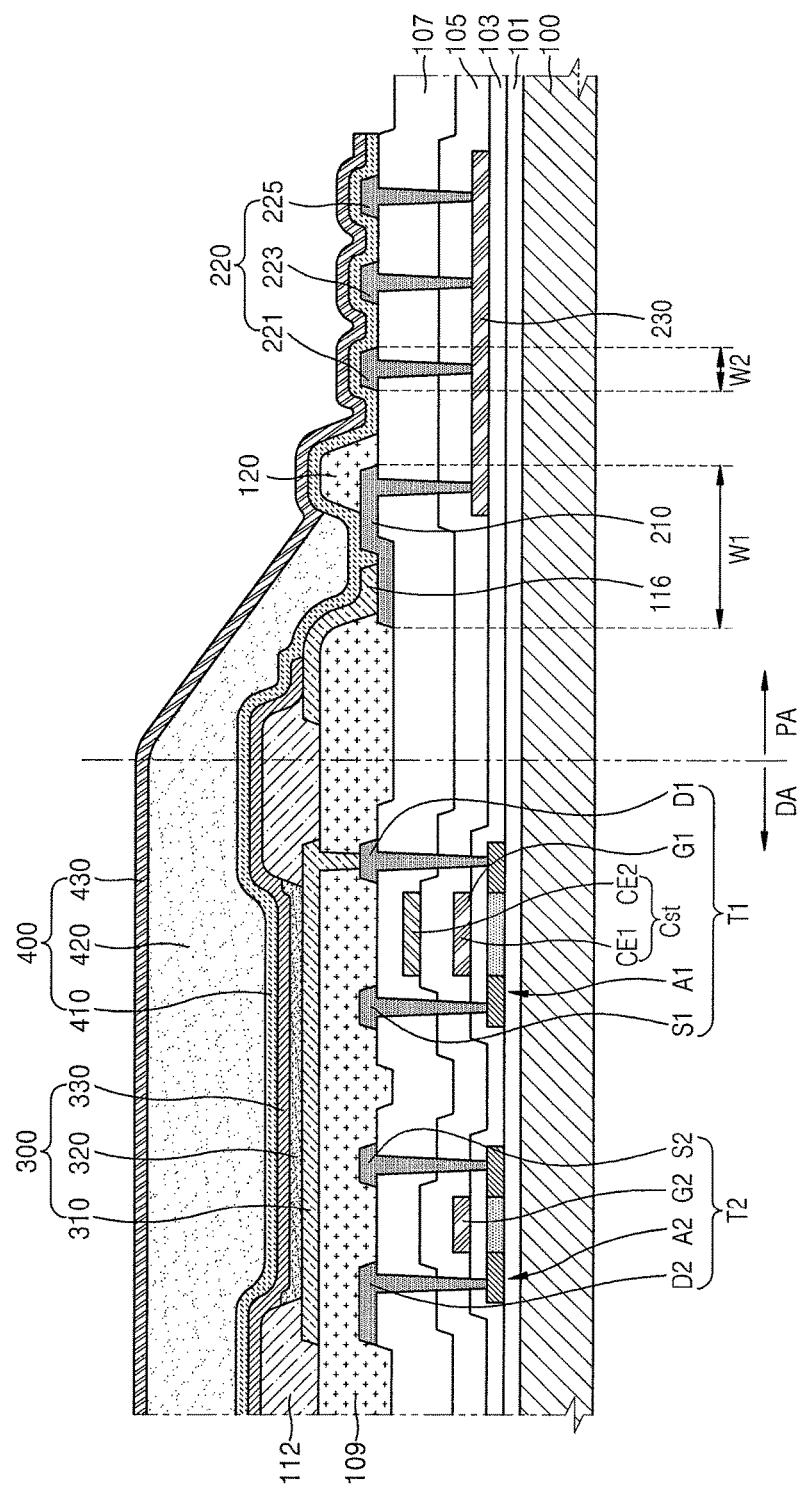
FIG. 2 illustrates a cross-sectional view taken along a line I-I' of the display apparatus of FIG. 1.

FIG. 2 is a cross-sectional view taken along a line I-I' of the display apparatus of FIG. 1. Referring to FIG. 2, the display apparatus according to an example embodiment may include the substrate 100 including the display area DA and the peripheral area PA, and a thin-film encapsulation layer 400 sealing the display area DA and the peripheral area PA.

The substrate 100 may include various materials. For example, the substrate 100 may include transparent glass materials having silicon oxide ($SiO_2$) as a main component. In another implementation, the substrate 100 may be formed of transparent plastic materials. Plastic materials may include organic materials selected from insulating organic materials such as polyethersulfone (PES), polyacrylate (PAR), polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), and cellulose acetate propionate (CAP).

A buffer layer 101 may be on the substrate 100, and may help to reduce or block the penetration of foreign materials, moisture, or external air from a lower side of the substrate 100 of the substrate 100, and may provide a flat surface on the substrate 100. The buffer layer 101 may include, for example, an inorganic material, such as an oxide or nitride, an organic material, or an organic-inorganic composite material, and may have a single-layer structure or a multi-layer structure including an inorganic material or an organic material.

A first TFT T1 may include a semiconductor layer A1, a gate electrode G1, a source electrode S1, and a drain electrode D1, and a second TFT T2 may include a semiconductor layer A2, a gate electrode G2, a source electrode S2, and a drain electrode D2.

Hereinafter, FIG. 2 shows that the TFTs T1 and T2 are top gate-type TFTs, but the TFTs T1 and T2 may be of various types such as a bottom gate-type TFT.

Furthermore, although the number of TFTs, for example, the first and second TFTs T1 and T2, is two in an example, a pixel of a display apparatus may include, for example, two or more of the TFTs T1 and T2. In some embodiments, a pixel may include six or seven TFTs T1 and T2, and the number of the TFTs T1 and T2 may vary.

The semiconductor layers A1 and A2 may include amorphous silicon or polycrystalline silicon. In another example embodiment, the semiconductor layers A1 and A2 may include at least one oxide of a material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). Each of the semiconductor layers A1 and A2 may include a channel region, and a source region and a drain region, and the source region and the drain region may have a carrier concentration that is higher than that of the channel region.

The gate electrodes G1 and G2 may be disposed over the semiconductor layers A1 and A2 with a gate insulating layer 103 therebetween. Each of the gate electrodes G1 and G2 may include, for example, molybdenum (Mo), aluminum (Al), copper (Cu), or Ti and may have a single-layer structure or a multilayer structure. For example, each of the gate electrodes G1 and G2 may include a single layer of Mo.

The gate insulating layer 103, which insulates the semiconductor layers A1 and A2 from the gate electrodes G1 and G2, may include, for example, $SiO_2$, silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

The source electrodes S1 and S2 and the drain electrodes D1 and D2 may be disposed on an interlayer insulating layer 107. Each of the source electrodes S1 and S2 and the drain electrodes D1 and D2 may include, for example, Mo, Al, Cu, or Ti, and may have a single-layer structure or a multilayer structure including the above materials. For example, each of the source electrodes S1 and S2 and the drain electrodes D1 and D2 may have a multilayer structure of Ti/Al/Ti.

The interlayer insulating layer 107 may include, for example, $SiO_2$, SiNx, SiON, $Al_2O_3$, $TiO_2$, $Ta_2O_5$, $HfO_2$ or $ZrO_2$.

A first electrode CE1 of a storage capacitor Cst may overlap the first TFT T1. In some embodiments, the first electrode CE1 of the storage capacitor Cst may be integrally formed with the gate electrode G1. Thus, the gate electrode G1 of the first TFT T1 may function as the first electrode CE1 of the storage capacitor Cst.

A second electrode CE2 of the storage capacitor Cst may overlap the first electrode CE1 and with a dielectric layer 105 therebetween. The second electrode CE2 may include, for example, Mo, Al, Cu, or Ti, and may have a single-layer structure or a multilayer structure including the above materials. For example, the second electrode CE2 may include a single layer of Mo or a multilayer structure of Mo/Al/Mo.

The dielectric layer 105 may include, for example, an inorganic material including oxide or nitride. For example, the dielectric layer 105 may include $SiO_2$, SiNx, SiON, $Al_2O_3$, $TiO_2$, $Ta_2O_5$, $HfO_2$ or $ZrO_2$.

A planarization layer 109 may be located on the source electrodes S1 and S2 and the drain electrodes D1 and D2, and an OLED may be located on the planarization layer 109. The planarization layer 109 may include, for example, organic materials, and may have a single-layer structure or a multilayer structure. The organic materials of the planarization layer 109 may include, for example, a general polymer such as polymethylmethacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. Furthermore, the planarization layer 109 may include a composite laminate of an inorganic insulating film and an organic insulating film.

In the display area DA of the substrate 100, an OLED 300 may be located on the planarization layer 109, the OLED 300 including a pixel electrode 310, a counter electrode 330, and an intermediate layer 320 therebetween and including an emission layer. The pixel electrode 310 may contact any one of the source electrode S1 and the drain electrode D1 of the first TFT T1 through an opening formed in the planarization layer 109, and may be electrically connected to the first TFT T1.

The pixel electrode 310 may include a reflective electrode. For example, the pixel electrode 310 may include a reflective film formed of Ag, Mg, Al, Pt, Pd, Au, Ni, Nd, Ir, Cr, or a compound thereof, and a transparent or semi-transparent electrode layer formed on the reflective film. The transparent or semi-transparent electrode layer may include, for example, indium tin oxide (ITO), indium zinc oxide (IZO), zinc oxide (ZnO), indium oxide ($In_2O_3$), indium gallium oxide (IGO), or aluminum zinc oxide (AZO).

A pixel-defining layer 112 may be disposed on the planarization layer 109. The pixel-defining layer 112 may define pixels by including an opening corresponding to each sub-pixel, for example, an opening exposing at least a center of the pixel electrode 310. Furthermore, the pixel-defining layer 112 may prevent generation of an arc on edges between the pixel electrode 310 by increasing a distance between the edges of the pixel electrode 310 and the counter electrode 330 above the pixel electrode 310. The pixel-defining layer 112 may be formed of, for example, an organic material such as PI or hexamethyldisiloxane (HMDSO).

The intermediate layer 320 of the OLED 300 may include a low molecular weight material or a polymer material. If the intermediate layer 320 includes a low molecular weight material, the intermediate layer 320 may have a single or a composite structure by stacking one or more of a Hole Injection Layer (HIL), a Hole Transport Layer (HTL), an Emission Layer (EML), an Electron Transport Layer (ETL), and an Electron Injection Layer (EIL). The intermediate layer 320 may include various organic materials, such as copper phthalocyanine (CuPc), N,N-Di(naphthalene-1-yl)-N,N'-diphenyl-benzidine (NPB), and tris-8-hydroxyquinoline aluminum (Alq3). The layers may be formed by, for example, an evaporation method.

When the intermediate layer 320 includes a polymer material, the intermediate layer 320 may have a structure including an HTL and an EML. The HTL may include, for example, poly-(2,4)-ethylene-dihydroxy thiophene (PE-DOT), and the EML may include, for example, a polymer material, such as poly(p-phenylene vinylene) (PPV) or polyfluorene. The intermediate layer 320 may be formed, for example, by using a screen printing method, an ink jet printing method, or a laser-induced thermal imaging (LITI) method. The intermediate layer 320 may have various structures. Also, the intermediate layer 320 may include a one-body layer over all the plurality of pixel electrodes 310 or may include layers patterned to respectively correspond to the pixel electrodes 310.

The counter electrode 330 may be disposed over the display area DA to cover the display area DA, as shown in FIG. 2. The counter electrode 330 may correspond to the plurality of pixel electrodes 310 by being formed as one-body over a plurality of OLEDs.

The counter electrode 330 may be a light-transmitting electrode. For example, the counter electrode 330 may be a transparent electrode or a reflective electrode, and may include, for example, a metal thin-film having a small work function, including, for example, Li, Ca, lithium fluoride (LiF)/Ca, LiF/Al, Al, Ag, Mg, or a compound thereof. Furthermore, a transparent conductive oxide (TCO) layer including such as ITO, IZO, ZnO, or $In_2O_3$ may be disposed on the metal thin-film.

The pixel electrode 310 may be a reflective electrode and the counter electrode 330 may be a light-transmitting electrode. Thus, a type of the pixel electrode 310 may be a top-emission type in which light emitted from the intermediate layer 320 is irradiated to the counter electrode 330. In another implementation, a type of the pixel electrode 310 may be a bottom-emission type in which light emitted from the intermediate layer 320 is irradiated to the substrate 100. In this case, the pixel electrode 310 may include a transparent or semi-transparent electrode, and the counter electrode 330 may include a reflection electrode. Furthermore, a type of a display apparatus according to an example embodiment may be a double-sided emission type emitting light toward the front and rear sides of the display apparatus.

The peripheral area PA of the substrate 100 may include a main wiring 210, an auxiliary wiring 220, a connecting wiring 230, and a dam 120. The main wiring 210 and the auxiliary wiring 220 may include an identical layer and may be formed of an identical material. In some embodiments, the main wiring 210 and the auxiliary wiring 220 may include the same layer as that of the source electrodes S1 and S2 and the drain electrodes D1 and D2, and may be formed of the same material as that of the source electrodes S1 and S2 and the drain electrodes D1 and D2. The main wiring 210 may be disposed closer to the display area DA than the auxiliary wiring 220. The auxiliary wiring 220 may be spaced apart from the dam 120, as described in further detail below.

The main wiring 210 may be connected to the auxiliary wiring 220 through the connecting wiring 230. The connecting wiring 230 may include the same layer as that of the main wiring 210 and the auxiliary wiring 220, and, as shown in FIG. 2, may be disposed below the main wiring 210 and the auxiliary wiring 220 and may be connected thereto through contact holes penetrating the dielectric layer 105 and the interlayer insulating layer 107.

In more detail, the connecting wiring 230 may include the same layer as that of the gate electrodes G1 and G2, and may be formed of the same material as that of the gate electrodes G1 and G2. The dielectric layer 105 and the interlayer insulating layer 107 may be disposed on the connecting wiring 230 as an insulating layer. The main wiring 210 and the auxiliary wiring 220 may be disposed on the interlayer insulating layer 107, and may be connected to the connecting wiring 230 by contact holes penetrating through the interlayer insulating layer 107 and the dielectric layer 105.

The main wiring 210 and the auxiliary wiring 220 may be connected to the counter electrode 330 of the OLED 300 and may transmit, for example, a common voltage ELVSS to a plurality of pixels of the display area DA. Although FIG. 2 illustrates an example of the main wiring 210 connected to the counter electrode 330 by a wiring 116, the main wiring 210 may be directly connected to the counter electrode 330.

A display apparatus according to an example embodiment may reduce a resistance value of a wiring by providing the auxiliary wiring 220 connected to the main wiring 210. When the main wiring 210 and the auxiliary wiring 220 function as a wiring transmitting, for example, the common voltage ELVSS to the plurality of pixels of the display area DA, a voltage drop phenomenon, which is generated depending on a location of a pixel, may be prevented or minimized.

The dam 120 may cover at least a part of the main wiring 210. In some embodiments, the dam 120 may cover an edge away from the display area DA among edges of the main wiring 210, wherein an edge near to the display area DA may be exposed. Thus, the dam 120 may cover an edge near to the auxiliary wiring 220 among edges of the main wiring 210, wherein a part of the main wiring 210 may be exposed.

The dam 120, when an organic encapsulation layer 420 of the thin-film encapsulation layer 400 is formed to seal the display area DA and the peripheral area PA, may prevent generation of an edge tail of the organic encapsulation layer 420 by blocking an organic material flowing in edge directions of the substrate 100.

The dam 120 may include, for example, the same material as that of the planarization layer 109. As described above, the planarization layer 109 may include an organic material, wherein bonding force between the organic material and metal may be superior to that between the organic material and an inorganic material forming the interlayer insulating layer 107. The dam 120 may overlap an edge of the main wiring 210 including metal. Thus, the dam 120 may be stably formed with advanced bonding force.

The thin-film encapsulation layer 400 may help prevent penetration of external oxygen and moisture by covering the display area DA and the peripheral area PA. The thin-film encapsulation layer 400 may include, for example, at least one organic encapsulation layer and at least one inorganic encapsulation layer. FIG. 2 illustrates an example of the thin-film encapsulation layer 400 including two inorganic encapsulation layers, for example, first and second inorganic encapsulation layers 410 and 430, and an organic encapsulation layer 420. However, a stacking order and the number of times of stacking are not limited to the example embodiment of FIG. 2.

The first inorganic encapsulation layer 410 covers the counter electrode 330 and may include, for example, $SiO_2$, SiNx, and/or SiON. Another layer, for example, a capping layer, may be between the first inorganic encapsulation layer 410 and the counter electrode 330. The shape of the first inorganic encapsulation layer 410 may be formed in accordance to the shape of a structure therebelow, and thus, as shown in FIG. 2, an upper surface thereof may not be flat. The organic encapsulation layer 420 may covers the first inorganic encapsulation layer 410. An upper surface of the organic encapsulation layer 420 may be formed as substantially flat. In more detail, the upper surface of the organic encapsulation layer 420 corresponding to the display area DA may be substantially flat. The organic encapsulation layer 420 may include, for example, at least one of PET, PEN, PC, PI, PES, polyoxymethylene (POM), PAR, and HMDSO. The second inorganic encapsulation layer 430 may cover the organic encapsulation layer 420 and may include, for example, $SiO_2$, SiNx, and/or SiON.

In this manner, the thin film encapsulation layer 400 may have a multilayer structure including the first inorganic encapsulation layer 410, the organic encapsulation layer 420, and the second inorganic encapsulation layer 430. Thus, even if a crack occurs in the thin film encapsulation layer 400, the crack may not be connected between the first inorganic encapsulation layer 410 and the organic encapsulation layer 420, or between the organic encapsulation layer 420 and the second inorganic encapsulation layer 430 through the multilayer structure. In this manner, the formation of a penetration path of external moisture or oxygen into the display area DA and the peripheral area PA may be prevented or minimized.

The dam 120 may block an organic material flowing in edge directions of the substrate 100 when the organic encapsulation layer 420 is formed, and thus, the organic encapsulation layer 420 may be contained inside the dam 120. Therefore, the organic encapsulation layer 420 may not be exposed to the outside because the second inorganic encapsulation layer 430 may contacts the first inorganic encapsulation layer 410 over the dam 120 and the auxiliary wiring 220.

The auxiliary wiring 220 may prevent or minimize formation of a penetration path of external moisture or oxygen penetrating from edges of the substrate 100 while reducing a resistance value of the main wiring 210. As the auxiliary wiring 220 is formed, the first and second inorganic encapsulation layers 410 and 430, which are disposed on the auxiliary wiring 220, may be formed in accordance to the shape of the auxiliary wiring 220. Therefore, the first and second inorganic encapsulation layers 410 and 430 may have a curved shape in a thickness direction of the auxiliary wiring 220. As a result, penetration of external moisture or oxygen into the display area DA may be prevented or minimized because a penetration path of external moisture and/or oxygen is longer.

The auxiliary wiring 220 may include one or more auxiliary wirings as shown in FIG. 2. In some embodiments, the auxiliary wiring 220 may include a first auxiliary wiring 221, a second auxiliary wiring 223, and a third auxiliary wiring 225. The first to third auxiliary wirings 221, 223, and 225 may be spaced apart from each other by a predetermined distance.

The auxiliary wiring 220 may include a plurality of auxiliary wirings, and the length of the first and second inorganic encapsulation layers 410 and 430 formed above the auxiliary wiring 220 and curved in a thickness direction of the auxiliary wiring 220 may increase. As a result, a function of preventing or minimizing penetration of external moisture or oxygen may be enhanced.

A width W2 of the auxiliary wiring 220 may be less than a width W1 of the main wiring 210. With the width W2 of the auxiliary wiring 220 less than the width W1 of the main wiring 210 and the number of widths W2 is plural, a function of preventing penetration of external air and reducing the size of the peripheral area PA may be enhanced.

According to an example embodiment as described above, a wiring disposed in the peripheral area PA may be divided into the main wiring 210 and the auxiliary wiring 220, and the auxiliary wiring 220 may function as a blocking unit helping to prevent formation of a penetration path of external moisture or oxygen. Therefore, the size of the peripheral area PA may be reduced because a penetration path of external air may be blocked without a separate blocking unit.

Figure 3:
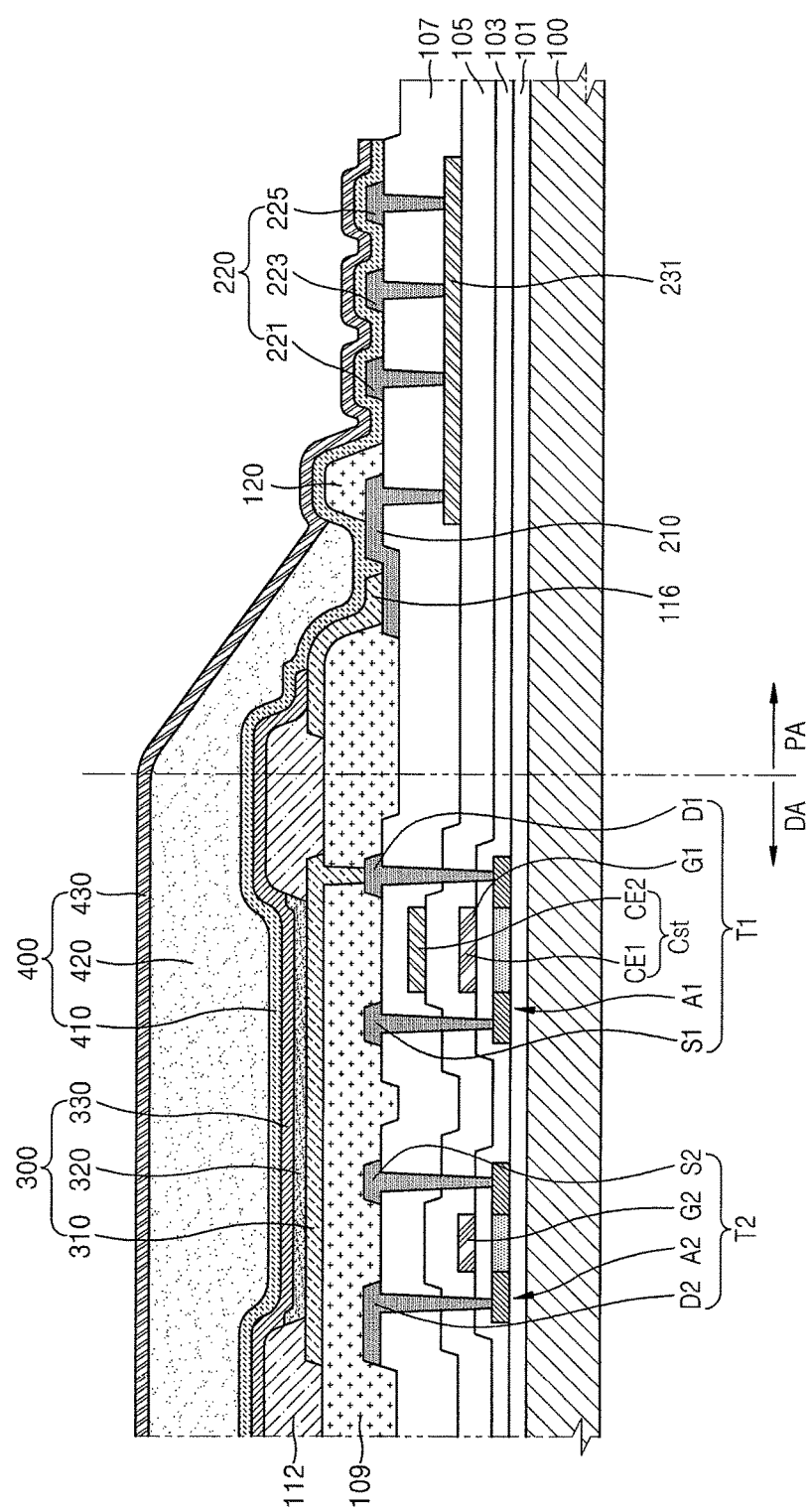
FIG. 3 illustrates a cross-sectional view of a display apparatus according to another example embodiment.

FIG. 3 is a cross-sectional view of a display apparatus according to another example embodiment. In FIG. 3, like reference numerals in FIG. 2 denote like elements, and repeated descriptions thereof will be omitted for simplicity.

Referring to FIG. 3, in the display apparatus according to the present example embodiment, a connecting wiring 231 connecting the main wiring 210 and the auxiliary wiring 220 may be disposed below the main wiring 210 and the auxiliary wiring 220. The connecting wiring 231 may be disposed between the main wiring 210 and the auxiliary wiring 220 and the interlayer insulating layer 107 that is an insulating layer, and may be connected to the main wiring 210 and the auxiliary wiring 220 through contact holes.

The connecting wiring 231 may be provided in the same layer as that of the second electrode CE2 of the storage capacitor Cst, and may be formed of the same material as that of the second electrode CE2 of the storage capacitor Cst. For example, the connecting wiring 231 may be disposed on the dielectric layer 105, and the insulating layer 107 may be disposed on the connecting wiring 231. The connecting wiring 231 may be connected to the main wiring 210 and the auxiliary wiring 220 through contact holes penetrating through the interlayer insulating layer 107.

Figure 4:
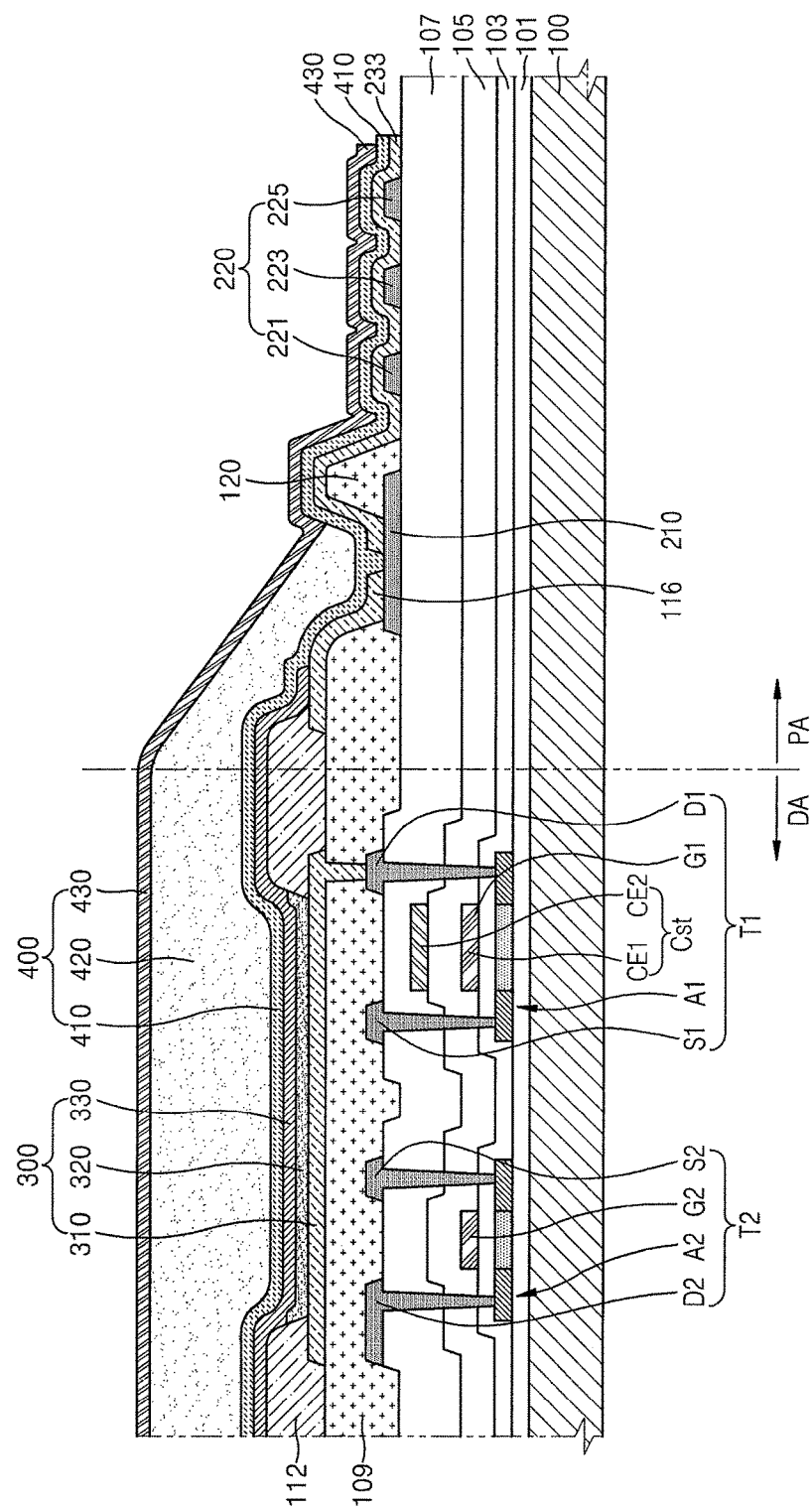
FIG. 4 illustrates a cross-sectional view of a display apparatus according to another example embodiment.

Although FIGS. 2 and 3 illustrates an example of the connecting wirings 230 and 231 disposed below the main wiring 210 and the auxiliary wiring 220, a connecting wiring may include the same layer as that of the main wiring 210 and the auxiliary wiring 220, and, as shown in FIG. 4 illustrating another example embodiment, a connecting wiring 233 may be disposed over the main wiring 210 and the auxiliary wiring 220.

Referring to FIG. 4, in the display apparatus according to the present example embodiment, the connecting wiring 233 connecting the main wiring 210 and the auxiliary wiring 220 may be disposed over the main wiring 210 and the auxiliary wiring 220. The connecting wiring 233 may be connected to an upper portion of the main wiring 210 exposed by the dam 120, and may connect the main wiring 210 and the auxiliary wiring 220 by extending and being connected to an upper portion of the dam 120 and an upper portion of the auxiliary wiring 220.

In this case, the connecting wiring 233 may include the same material as that of the pixel electrode 310. Furthermore, as shown in FIG. 4, the connecting wiring 233 may be spaced apart from the connecting wiring 116 connecting the counter electrode 330 and the main wiring 210. The connecting wiring 233 may be integrally formed with the wiring 116 by connecting the same.

Figure 5:
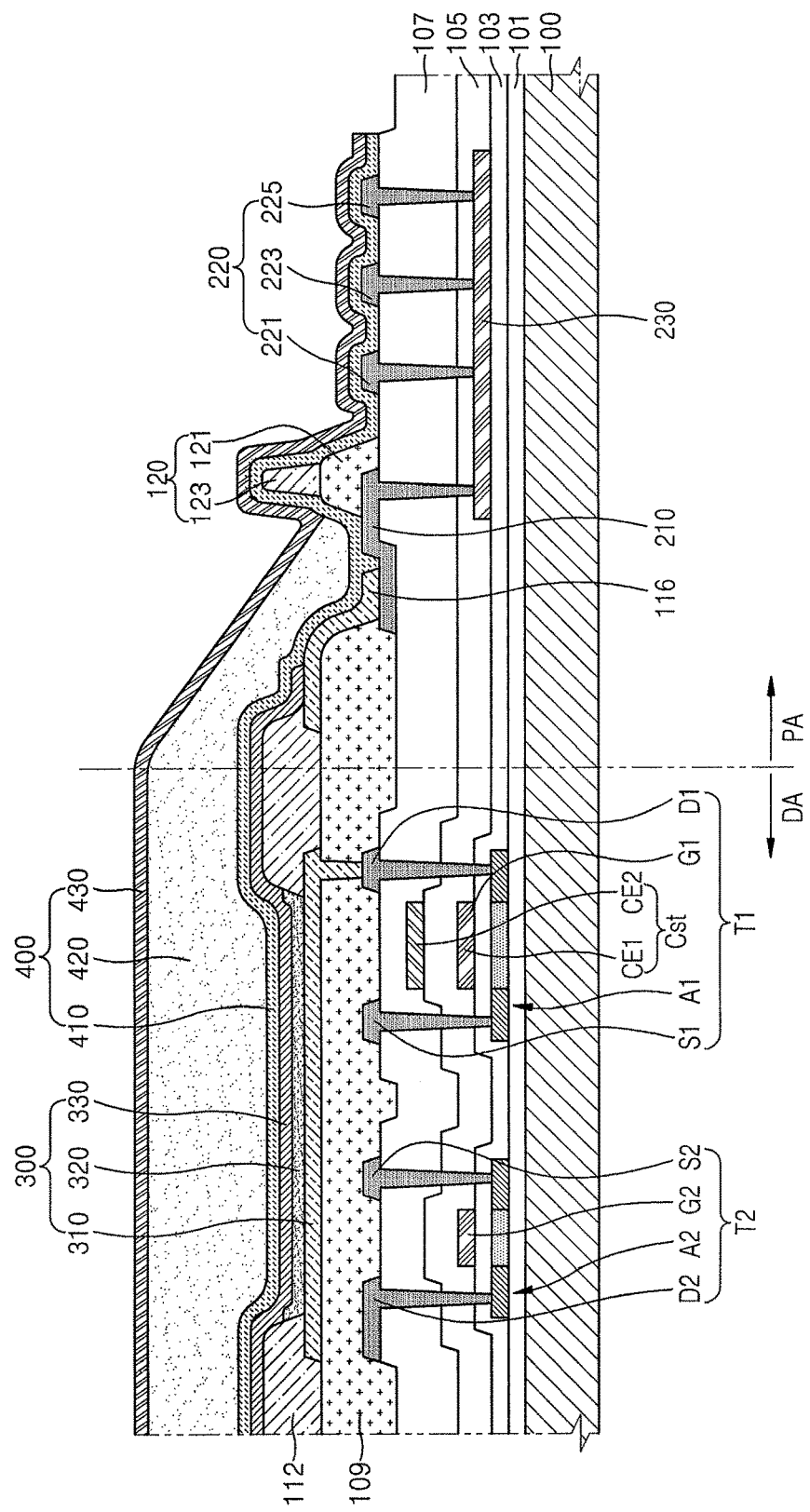
FIG. 5 illustrates a cross-sectional view of a display apparatus according to another example embodiment.

FIG. 5 is a cross-sectional view of a display apparatus according to another example embodiment. In FIG. 5, like reference numerals in FIG. 2 denote like elements, and repeated descriptions thereof will be omitted for simplicity.

According to an example embodiment, the dam 120 may be formed of a plurality of layers. As shown in FIG. 5, the dam 120 may include first dam layer 121 and a second dam layer 123. In this case, the first dam layer 121 may include the same material as that of the planarization layer 109, and the second dam layer 123 may include the same material as that of the pixel-defining layer 112.

Figure 6:
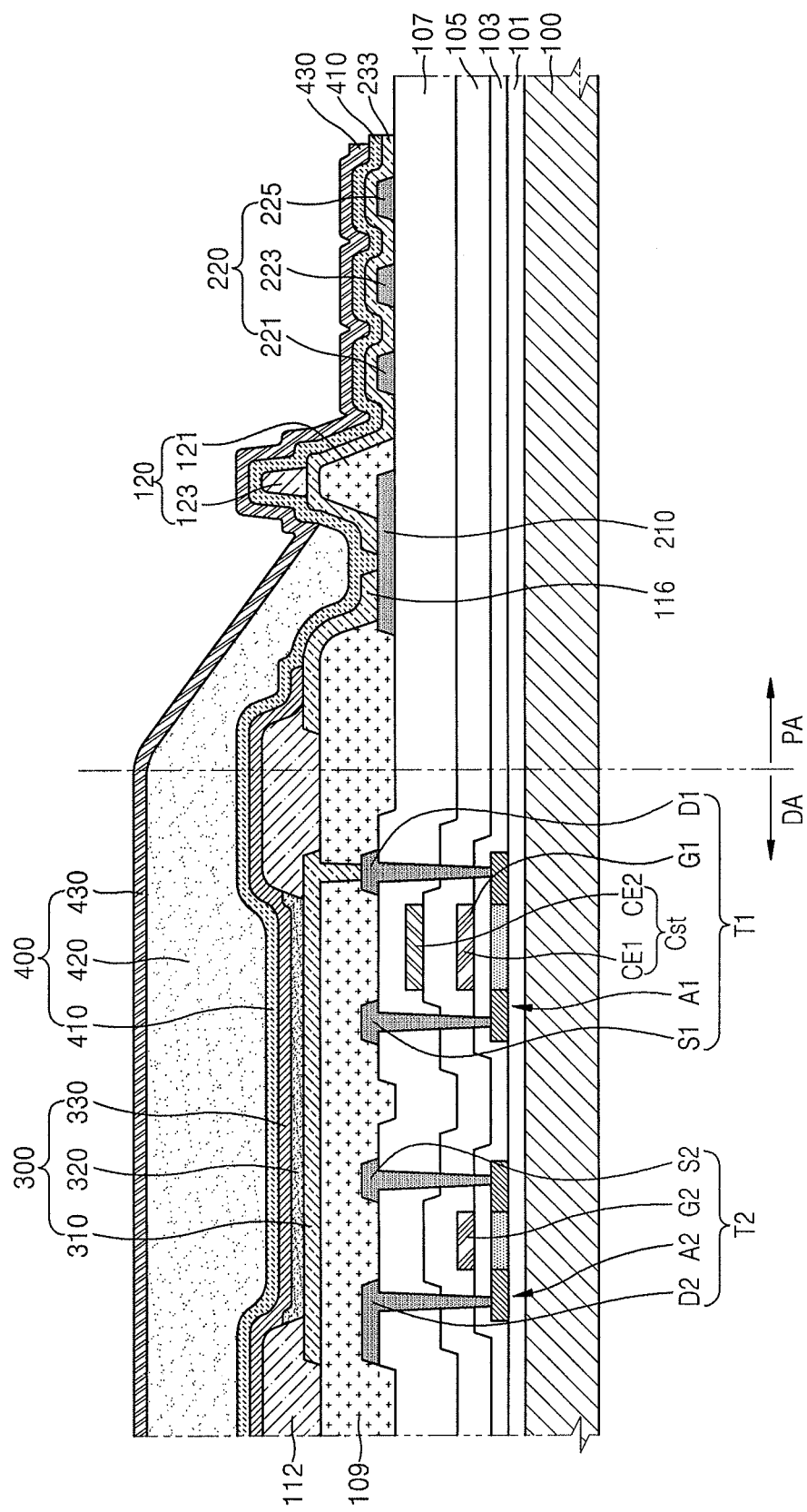
FIG. 6 illustrates a cross-sectional view of a display apparatus according to another example embodiment.

FIG. 6 is a cross-sectional view of a display apparatus according to another example embodiment. In FIG. 6, like reference numerals in FIG. 4 denote like elements, and repeated descriptions thereof will be omitted for simplicity.

According to an example embodiment, the dam 120 may include the first and second dam layers 121 and 123, and the connecting wiring 233 may be extended to an upper portion of the auxiliary wiring 220 by crossing from an upper portion of the main wiring 210 to the first and second dam layers 121 and 123.

Figure 7A:
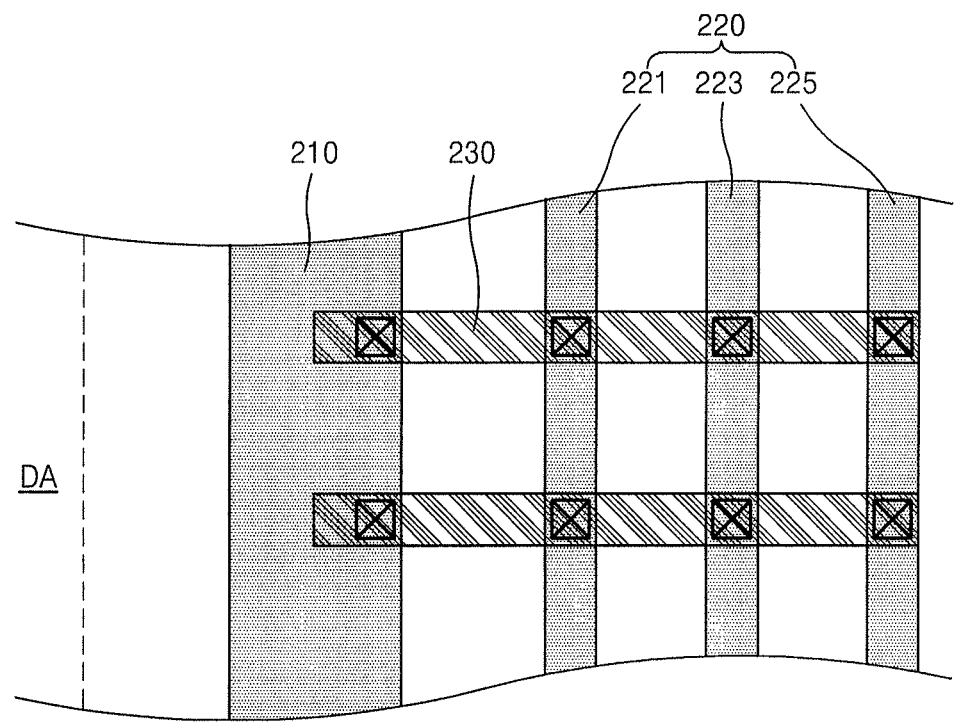
FIGS. 7A to 7C illustrate plan views of a planar shape of an auxiliary wiring according to one or more example embodiments.
Figure 7B:
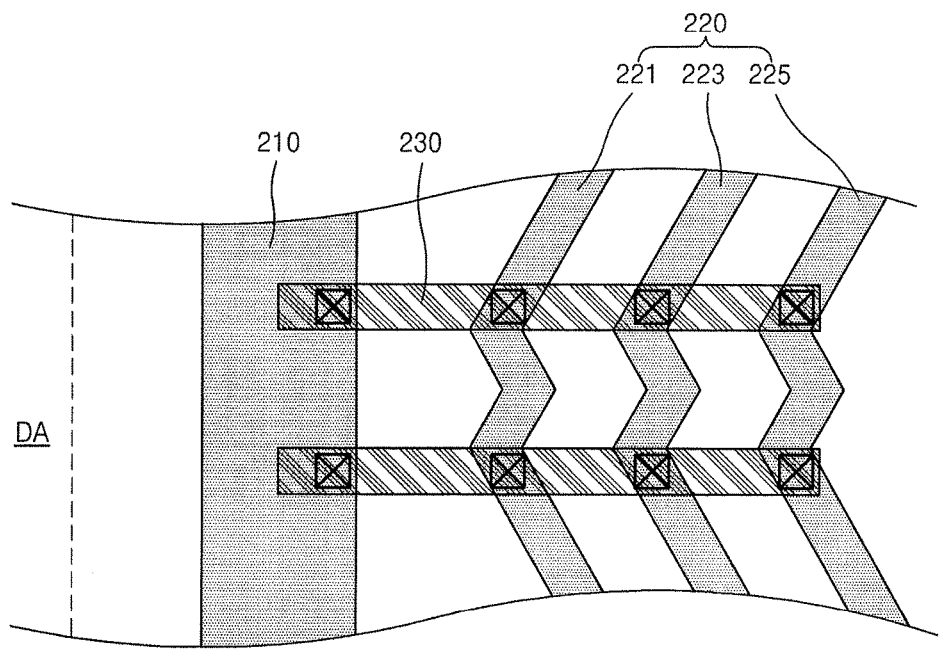
Figure 7C:
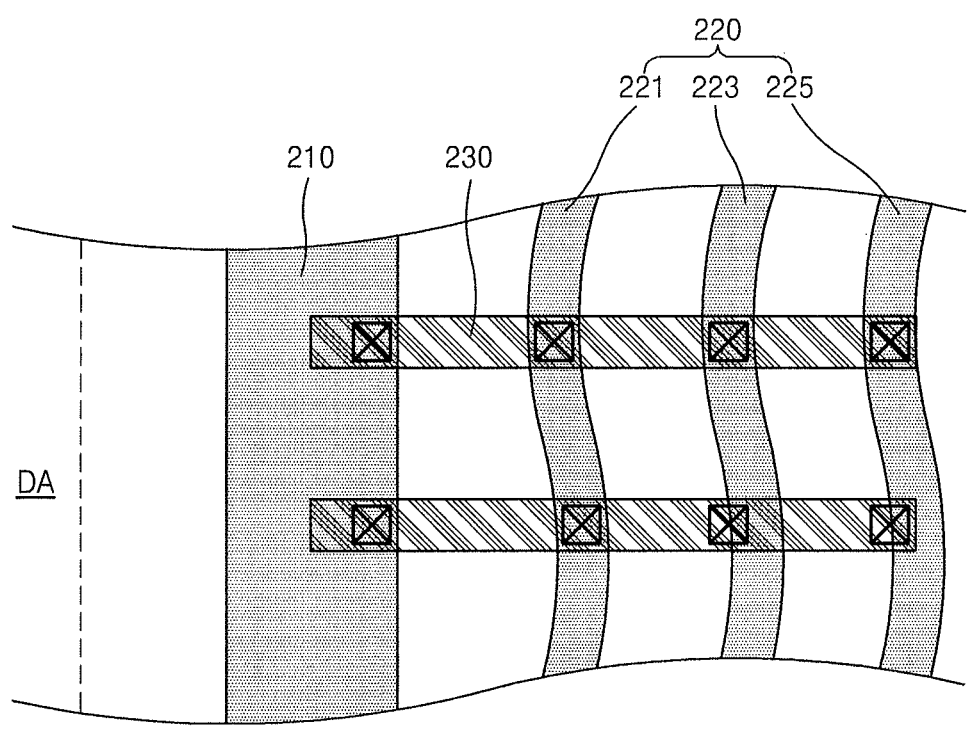

FIGS. 7A to 7C are plan views of a planar shape of an auxiliary wiring according to one or more example embodiments.

Referring to FIGS. 7A to 7C, the main wiring 210 may be disposed along a side of the display area DA. In some example embodiments, the main wiring 210 may be disposed along a side of the display area DA surrounding at least a part of the display area DA.

The auxiliary wiring 220 may have, for example, a straight-line shape spaced apart from the main wiring 210 at a certain distance as shown in FIG. 7A. The auxiliary wiring 220 may have various shapes such as a zigzag shape or a curved shape as shown in FIGS. 7B and 7C.

FIGS. 7A to 7C illustrates that the connecting wiring 230 is connected to the main wiring 210 and the auxiliary wiring 220 through contact holes, but the connecting wiring 230, as described above with reference to FIGS. 4 and 6, may be disposed over the main wiring 210 and the auxiliary wiring 220 or in the same layer as that of the main wiring 210 and the auxiliary wiring 220.

By way of summation and review, a display apparatus may include a display area displaying an image and a peripheral area in which wirings that transmit signals to the display area are disposed. A display apparatus in which high quality is maintained and the size of a peripheral area is reduced is desirable.

As described above, embodiments may provide a display apparatus capable of preventing an invasion of external moisture or oxygen while reducing the size of a peripheral area.

According to the example embodiments as described above, a wiring disposed in the peripheral area may be divided into the main wiring and the auxiliary wiring, and thus, a resistance value of a wiring may be reduced. At the same time, the auxiliary wiring may function as a blocking unit preventing a penetration path of external moisture or oxygen. Therefore, the size of the peripheral area may be reduced because a penetration path of external air is blocked without a separate blocking unit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
    a substrate including a display area displaying an image and a peripheral area outside the display area;
    a main wiring and an auxiliary wiring disposed in an identical layer in the peripheral area, the main wiring being disposed closer to the display area than the auxiliary wiring;

a dam configured to cover at least a part of the main wiring, the auxiliary wiring being spaced apart from the dam; and a connecting wiring configured to connect the main wiring to the auxiliary wiring; and a thin-film encapsulation layer configured to seal the display area and the peripheral area.

2. The display apparatus as claimed in claim 1, wherein the connecting wiring is disposed below the main wiring and the auxiliary wiring with an insulating layer interposed between the main wiring and the auxiliary wiring, and is connected to the main wiring and the auxiliary wiring through contact holes penetrating the insulating layer.

3. The display apparatus as claimed in claim 1, wherein the connecting wiring extends from an upper portion of the main wiring to the upper portion of the auxiliary wiring through an upper portion of the dam, to connect the main wiring and the auxiliary wiring.

4. The display apparatus as claimed in claim 1, wherein the dam is configured to cover an edge near to the auxiliary wiring among edges of the main wiring, wherein a part of the main wiring is exposed.

5. The display apparatus as claimed in claim 1, wherein the auxiliary wiring is plural, and the auxiliary wirings are connected to each other through the connecting wiring.

6. The display apparatus as claimed in claim 1, wherein the auxiliary wiring has a curved shape.

7. The display apparatus as claimed in claim 1, wherein:
the thin-film encapsulation layer includes a stack structure of a first inorganic encapsulation layer, a first organic encapsulation layer, and a second inorganic encapsulation layer, and
the first inorganic encapsulation layer contacts the second inorganic encapsulation layer on the auxiliary wiring.

8. The display apparatus as claimed in claim 1, wherein a width of the main wiring is greater than a width of the auxiliary wiring.

9. The display apparatus as claimed in claim 1, wherein:
the display area includes a display device including a pixel electrode, a counter electrode facing the pixel electrode, and an intermediate layer disposed between the pixel electrode and the counter electrode, and
the main wiring is connected to the counter electrode.

10. The display apparatus as claimed in claim 1, wherein:
the display area includes a thin-film transistor including a semiconductor layer, a gate electrode, a source electrode, and a drain electrode, and
the connecting wiring is provided in the same layer as that of the gate electrode.

11. The display apparatus as claimed in claim 1, wherein:
the display area includes a thin-film transistor including a semiconductor layer, a gate electrode, a source electrode, and a drain electrode, and a storage capacitor overlapping the thin-film transistor,
the storage capacitor includes a first electrode, a dielectric layer, and a second electrode integrally formed with the gate electrode that are sequentially stacked on the storage capacitor, and
the connecting wiring is provided in the same layer as that of the second electrode.

12. The display apparatus as claimed in claim 1, wherein:
the display area includes a display device including a pixel electrode, a counter electrode facing the pixel electrode, an intermediate layer disposed between the pixel electrode and the counter electrode, and
the connecting wiring includes the same material as that of the pixel electrode.

13. The display apparatus as claimed in claim 1, wherein:
the display area includes a thin-film transistor including a semiconductor layer, a gate electrode, a source electrode, and a drain electrode, and
the main wiring includes the same material as that of a source electrode and a drain electrode.

14. The display apparatus as claimed in claim 1, wherein the dam includes a plurality of layers.

15. The display apparatus as claimed in claim 1, wherein:
the dam includes first and second dam layers, and
the connecting wiring extends from an upper portion of the main wiring to the upper portion of the auxiliary wiring through the first and second dam layers, to connect the main wiring and the auxiliary wiring.

* * * * *